United States Patent [19]

Schülke

[11] 4,397,897

[45] Aug. 9, 1983

[54] BELL OF TRANSLUCENT FUSED SILICA FOR THE PRECIPITATION OF POLYSILICON

[75] Inventor: Karl A. Schülke, Neuberg, Fed. Rep. of Germany

[73] Assignee: Heraeus Quarzschmelze GmbH, Hanau, Fed. Rep. of Germany

[21] Appl. No.: 331,938

[22] Filed: Dec. 17, 1981

[30] Foreign Application Priority Data

Feb. 27, 1981 [DE] Fed. Rep. of Germany ....... 3107421

[51] Int. Cl.³ .............................................. B65D 1/00
[52] U.S. Cl. ..................................... 428/35; 428/156; 428/428; 428/542.8; 422/102; 422/240
[58] Field of Search ............... 428/428, 446, 213, 156, 428/542.8, 35; 423/335; 432/156, 264, 265; 422/102, 240, 241; 156/DIG. 83

[56] References Cited

U.S. PATENT DOCUMENTS 3,882,901  5/1975  Seller et al. ............................ 428/35
3,927,697  12/1975  Baumler et al. ....................... 428/35
3,962,515  6/1976  Dumbaugh, Jr. et al. ......... 428/428

OTHER PUBLICATIONS

Technical Bulletin Q-B 3/113, "Quartz glass for the Semi-Conductor Technology", published by Heraeus Quartzschmelze GmbH, Hanau, West Germany, Sep. 1979.

*Primary Examiner*—O. R. Vertiz
*Assistant Examiner*—Jackson Leeds
*Attorney, Agent, or Firm*—Sprung, Horn, Kramer & Woods

[57] ABSTRACT

Bell of translucent fused silica having an inner layer of transparent fused silica for the precipitation of polysilicon. The thickness of the transparent fused silica layer increases continuously towards the open end of the bell while the total wall thickness of the bell is kept constant. The thickness increase of the transparent fused silica layer begins preferably beyond the center of the total length of the bell. The thickness of the transparent fused silica layer increases by at least half of the thickness which it has in the top part of the bell.

5 Claims, 1 Drawing Figure

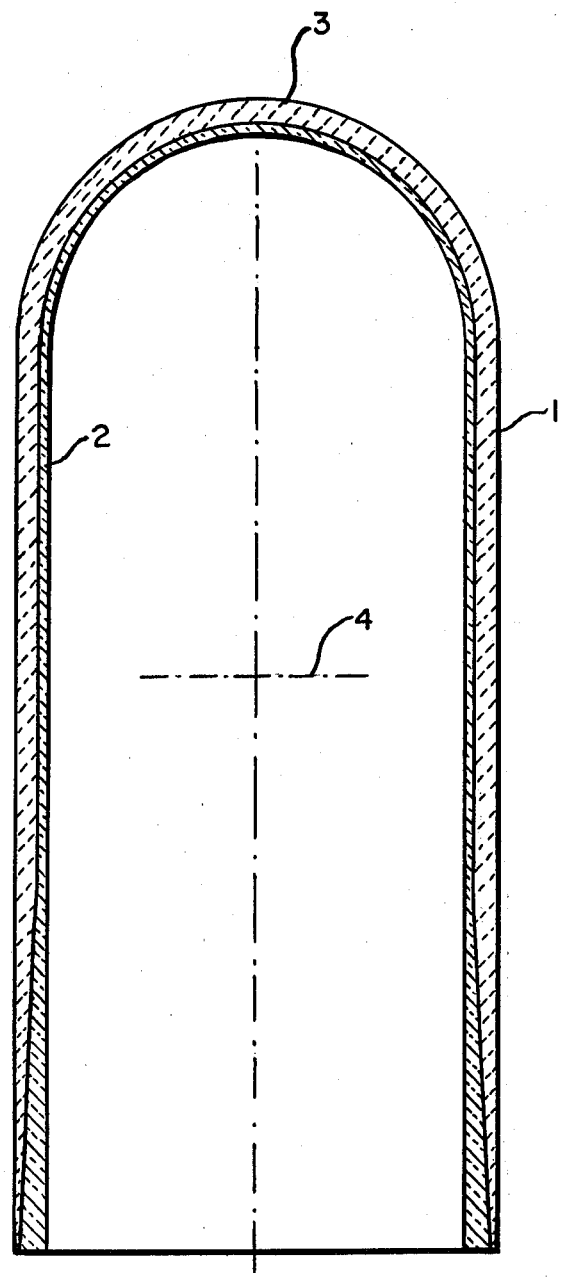

BELL OF TRANSLUCENT FUSED SILICA FOR THE PRECIPITATION OF POLYSILICON

BACKGROUND OF THE INVENTION

1. Field of the Invention

The invention relates to a bell of translucent fused silica having an internal layer of transparent fused silica for the precipitation of polysilicon.

2. Discussion of Prior Art

Bells of the kind described above have long been in technical use, and they are described, for example, in the applicant's prospectus Q-B 3/113 "Quarzglas für die Halblietertechnik", September 1979. These bells have generally proven satisfactory. It is observed, however, that the bells can break as a result of thermally induced internal tensions.

It is the object of the invention to provide a bell of translucent fused silica for the precipitation of polysilicon, in which the above-described danger of breakage is reduced, so that the bell has a considerably longer useful life than the known bells.

SUMMARY OF INVENTION

This object is achieved by a translucent fused silica bell interiorly lined by a layer of transparent fused silica which layer increases continually toward the open end of the bell, while the total thickness of the bell wall remains constant. Bells have proven satisfactory in which the increase in the thickness of the transparent fused silica layer begins below the center of the total length of the bell, preferably after ⅔ of the total length of the bell from the top thereof, assuming the closed end to be at the top. Advantageously the thickness of the transparent fused silica increases by at least half of the thickness which it has in that portion of the bell in which it remains constant. Bells have been found especially satisfactory in which the thickness of the transparent fused silica layer at the open end of the bell is increased until it accounts for the entire thickness of the bell.

The observed reduction of the danger of breakage of bells in accordance with the invention and hence their extended life in comparison with known bells, is probably to be credited to the fact that the increasing thickness of the transparent fused silica results in a greater absorption of thermal radiation from the reaction chamber, that a better thermal conduction radially through the wall is established, and that a greater amount of material of higher tensile strength is present in the area of the open end of the bell where the danger of breakage is greatest.

BRIEF DESCRIPTION OF DRAWING

In the appended drawing, there is shown a bell of this invention in longitudinal cross-section.

DESCRIPTION OF SPECIFIC EMBODIMENT

Referring to the drawing, the outer portion 1 of translucent fused silica, which is fused together with an inner layer 2 of transparent fused silica. As can be seen, the transparent fused silica inside layer is constant in the area of the top 3 of the bell and in the cylindrical portion adjacent thereto, and not until below the center 4 of the overall length of the bell does a continuous increase take place in the thickness of the transparent fused silica layer, which at the open end of the bell has increased by more than half of its original thickness.

The transparent fused silica inside layer can be produced by fusing crystalline quartz thereon, but it can also consist of synthetic transparent fused silica.

Generally, the transparent fused silica is present in a thickness, in the region of the closed end of 2 to 4 mm. In that portion of the wall of the bell remote from the open portion i.e., between the center of the bell's height and the curved closed end portion the transparent layer has a thickness of 2 to 4 mm. At this point, the thickness of the transparent layer can be more or less constant. Thereafter, especially from the center to the open end and more especially from a point ⅔ of the distance from the closed to open end, measured from the closed end, the thickness increases. The final thickness of the transparent layer at the open end of the bell can be 6 to 16 mm, while the total wall thickness of the bell at the open end can be 14 to 16 mm.

What is claimed is:

1. In a bell of translucent fused silica having an inner layer of transparent fused silica for the precipitation of polysilicon, the improvement wherein the thickness of the transparent fused silica layer increases continuously by at least half of its thickness in a area where the total wall thickness of the bell remains constant, towards the open end of the bell.

2. A bell according to claim 1, wherein the thickness of the transparent silica layer increases continuously by at least 2 mm towards the open end of the bell.

3. A bell of claim 1, wherein the increase in the thickness of the transparent fused silica layer begins after the center of the overall length of the bell.

4. A bell of claim 1, wherein the increase in the thickness of the transparent fused silica layer begins after ⅔ of the overall length of the bell from the top of the bell.

5. A bell according to claim 1, wherein at the open end, the thickness of the transparent fused silica layer accounts for the total wall thickness of the bell.

* * * * *